United States Patent [19]

Hayashi et al.

[11] Patent Number: 5,341,001

[45] Date of Patent: Aug. 23, 1994

[54] SULFIDE-SELENIDE MANGANESE-ZINC MIXED CRYSTAL PHOTO SEMICONDUCTOR AND LASER DIODE

[75] Inventors: Shigeo Hayashi, Moriguchi; Kazuhiro Okawa; Tsuneo Mitsuyu, both of Hirakata, all of Japan

[73] Assignee: Matsushita Electric Industrial Co., Ltd., Osaka, Japan

[21] Appl. No.: 9,240

[22] Filed: Jan. 26, 1993

[30] Foreign Application Priority Data

Feb. 13, 1992 [JP] Japan ................................. 4-026481
Feb. 13, 1992 [JP] Japan ................................. 4-026482

[51] Int. Cl.$^5$ ............................................. H01L 33/00
[52] U.S. Cl. ............................................. 257/94; 257/96; 257/97; 257/184; 257/200; 372/43; 372/44; 372/45
[58] Field of Search .............. 257/94, 96, 97, 184, 257/201, 200; 372/43, 44, 45, 46

[56] References Cited

U.S. PATENT DOCUMENTS

| | | | |
|---|---|---|---|
| 4,479,222 | 10/1984 | Hawrylo | 372/45 |
| 4,955,031 | 9/1990 | Jain | 372/44 X |
| 4,992,837 | 2/1991 | Sakai et al. | 372/43 X |
| 5,045,897 | 9/1991 | Ahlgren | 257/94 |
| 5,181,219 | 1/1993 | Mori et al. | 372/45 |

FOREIGN PATENT DOCUMENTS

| | | |
|---|---|---|
| 0373637A2 | 12/1989 | European Pat. Off. |
| 60-173893 | 9/1985 | Japan |
| 63-81990 | 4/1988 | Japan |
| WO92/21170 | 11/1992 | PCT Int'l Appl. |

OTHER PUBLICATIONS

Kaneko et al, "Yellow Light (576 nm) Lasing Emission of GaInP/AlInP Multiple Quantum Well Lasers Prepared by Gas-Source-Molecular-Beam-Epitaxy," *Electronics Letters*, May 10, 1990, vol. 26, No. 10, pp. 656–657.

Walecki et al, "Band Offsets and Exciton Confinement in $Zn_{1-y}Cd_ySe/Zn_{1-x}Mn_xSe$ Quantum Wells," *Appl. Phys. Lett.* 57(5), Jul. 30, 1990, pp. 466–468.

Ichino et al, "Fabrication of ZnCdSSe Alloys by MOMBE and Their Applications for Double-Hetero and Quantum Well Structures," *Journal of Crystal Growth*, 117 (1992), pp. 527–531.

Jeon, H. et al; "Blue-green injection laser diodes in (Zn,Cd)Se/ZnSe quantum wells", Appl. Phys. Lett. 59 (27), (Dec. 30, 1991) pp. 3619–3621.

Jeon et al.; "Blue and green diode lasers in ZnSe-based quantum wells", Appl. Phys. Lett. 60 (17), Apr. 27, 1992 (pp. 2045–2047).

*Primary Examiner*—William Mintel
*Attorney, Agent, or Firm*—Fish & Richardson

[57] ABSTRACT

Disclosed is a photo semiconductor material characterized in the blue to ultraviolet wavelength region. The semiconductor is firmed by lattice matching a sulfide-selenide manganese-zinc epitaxial mixed crystal film to the substrate. A blue laser diode is fabricated by forming a double hereto quantum well structure on a substrate by using sulfide-selenide manganese-zinc mixed crystal films as clad layers. A zinc molecular beam, a manganese molecular beam, a sulfur molecular beam, and a selenium molecular beam are simultaneously emitted onto a GaAs substrate in an ultrahigh vacuum, and a mixed crystal of $Zn_{1-x}Mn_xS_ySe_{1-y}$ ($0<x<1$, $0<y<1$) is obtained. In particular, the molecular beam pressure is adjusted so as to lattice matched to the substrate. As the material for the substrate, for example, GaAs and ZnSe may be used. Moreover, on an n-type GaAs single crystal substrate, a 2 μm thick chlorine doped n-type $Zn_{0.8}Mn_{0.2}S_{0.2}Se_{0.8}$ a layer, a 50 nanometer thick ZnSe active layer, and a 1 μm thick nitrogen doped p-type $Zn_{0.8}Mn_{0.2}S_{0.2}Se_{0.8}$ layer are formed. An Au electrode layer and an In electrode layer are formed at both sides of this structure, and an optical resonator by cleavage mirror is formed. This laser diode emits coherent light in the blue light spection at room temperature in the pulse current injection condition.

5 Claims, 2 Drawing Sheets

Lattice constant (nanometers)

SULFIDE-SELENIDE MANGANESE-ZINC MIXED CRYSTAL PHOTO SEMICONDUCTOR AND LASER DIODE

FIELD OF THE PRESENT INVENTION

The present invention relates to a group II-VI semiconductor compound useful as a photo semiconductor device in the blue light region, and a blue laser diode using the same.

BACKGROUND OF THE INVENTION

Photo semiconductor devices are known to be useful in many applications including display devices, optical communications, optical disks, and image processing means, and many materials have been proposed for them.

For example, a photo semiconductor device was first developed for use in the infrared region using GaAs compounds. Later, AlGaAs, AlGaInP and other materials using a shorter wavelength were proposed. At a shorter wavelength, the emission is visible so that used for display. There exist red to green LED for display now. If blue LED is turned to practical use, full color display system using LED is realized. At the same time, the recording density of an optical disk and other information processing devices may be enhanced. Accordingly, as a photo semiconductor material using a group II-VI wide gap semiconductor (mixed crystal) compounds, for example as disclosed in Applied Physics 6.0 (1991), p.536, ZnS, ZnSe, ZnTe, CdS, CdSe, and mixed crystals combining these compounds have been mainly proposed.

Above all concerning the laser diode, in group III-V semiconductor, compounds, the laser diode is obtained in at least a part of the yellow region by using GaInP-/AlInP, as disclosed in Electron. Lett. 26 (1990), p. 657. In group II-VI semiconductor compounds, the laser diode is obtained in at least part of the blue-green region, when converted to room temperature, by using a ZnCdSSe mixed crystal of a group II-VI semiconductor compounds, as disclosed in Appl. Phys. Lett. 60 (1992), p. 2045.

However, for the photo semiconductor, superior crystallinity is desired. From the viewpoint of using a lattice matching system, the problem is that the practical photo semiconductor element possessing a luminous wavelength from the blue to ultraviolet region cannot be obtained from existing material systems.

Besides, in a laser diode, no material is known to have a broad band offset in both the conduction band and the valence band, for the active layer for emitting a blue light, and a blue laser diode cannot be obtained.

SUMMARY OF THE INVENTION

It is hence, in the light of the above background, an object of the invention to present a material applicable to a photo semiconductor device from blue to short wavelength region, while maintaining an excellent crystallinity by lattice matching to a substrate. Another object is to achieve a blue laser diode using a material having a large band offset for ZnSe or a mixed crystal of $Zn_{1-z}Cd_zS_wSe_{1-w}$ ($0<z<1$, $0<w<1$) by lattice matching to the substrate.

An object of the invention is to provide a sulfide-selenide manganese-zinc photo semiconductor, comprising a sulfide-selenide manganese-zinc epitaxial mixed crystal film, wherein zinc, manganese, sulfur and selenium are formed on a semiconductor substrate, and the epitaxial mixed crystal film is lattice matched to the substrate.

It is preferable in this invention that the substrate is GaAs single crystal or ZnSe single crystal.

Another object of the invention is to provide a laser diode, comprising a double hereto quantum well structure on a substrate, whose clad layers are mixed crystal layers of n-type and p-type $Zn_{1-x}Mn_xS_ySe_{1-y}$ ($0<x<1$, $0<y<1$) which is lattice matched to the substrate, and whose active layer between the n-type clad layer and p-type clad layer is ZnSe or mixed crystal of $Zn_{1-z}Cd_zS_wSe_{1-w}$ ($0<x<1$, $0<y<1$). Electrical structure is pin structure including the substrate.

It is preferable in this invention that a compound selected from aluminum, gallium, indium, fluorine, chlorine, iodine, and bromine is doped as an n-type impurity of the mixed crystal of n-type $Zn_{1-x}Mn_xS_ySe_{1-y}$ ($0<x<1$, $0<y<1$), and a compound selected from nitrogen, phosphorus, arsenic, lithium, and sodium is doped as a p-type impurity of the mixed crystal of p-type $Zn_{1-x}Mn_xS_ySe_{1-y}$ ($0<x<1$, $0<y<1$).

It is preferable in this invention that the quantum well structure is formed in a lattice matched state on the substrate or in a state not inducing lattice relaxation.

It is preferable in this invention that the mixed crystals of n-type and p-type $Zn_{1-x}Mn_xSe_ySe_{1-y}$ ($0<x<1$, $0<y<1$) have carrier density at room temperature of $5\times10^{16}$ cm$^{-3}$ or more.

It is preferable in this invention that the active layer has a thickness of between 5.0 and 150 nanometers.

It is preferable in this invention that the substrate is a GaAs single crystal or ZnSe single crystal.

According to one embodiment of the first invention, a sulfide-selenide manganese-zinc mixed crystal epitaxial film comprising at least zinc, manganese, sulfur and selenium is formed on a substrate. The film is lattice matched to the substrate, so that excellent crystallinity is presented.

In a preferred constitution of the invention the substrate is GaAs or ZnSe, and excellent crystallinity is obtained in which the substrate has a lattice constant in a range of the available lattice constants of a sulfide-selenide manganese-zinc mixed crystal.

According to another embodiment of the invention, between the clad layer of $Zn_{1-x}Mn_xS_ySe_{1-y}$ ($0<x<1$, $0<y<1$) and the active layer of ZnSe, the common cation rule ( the rule that semiconductor compounds which are consisted from same element as cation have nearly same energy position of the top of valence bands) and the common anion rule (the rule that semiconductor compounds which are consisted from same element as anion have nearly same energy position of the bottom of conduction bands) can be applied. As for ZnSSe and ZnSe cation is common, so in connecting together the offset of the valence band is large. As for ZnMnSe and ZnSe anion is common and Mn have two outermost shell electrons same as Zn, so in connecting together the offset of the conduction band is large. Then bonded together, both band offsets between ZnMnSSe and ZnSe are large, so large value of carrier confinement is achieved. In this case, since the active layer has the larger refractive index compared to the clad layer, the light can be also confined in the ZnSe active layer. In the case of using, instead of ZnSe, a mixed crystal of $Zn_{1-z}Cd_zS_wSe_{1-w}$ ($0<z<1$, $0<w<1$) lattice matched to the substrate, large band offset and large difference of refractive index are also possible.

Therefore, by using these materials, since the active layer of ZnSe is of a direct transition type, and has a band gap of 2.7 eV or more at room temperature, a laser diode in a blue region is enabled at room temperature.

DETAILED DESCRIPTION OF THE INVENTION

Figure 1:
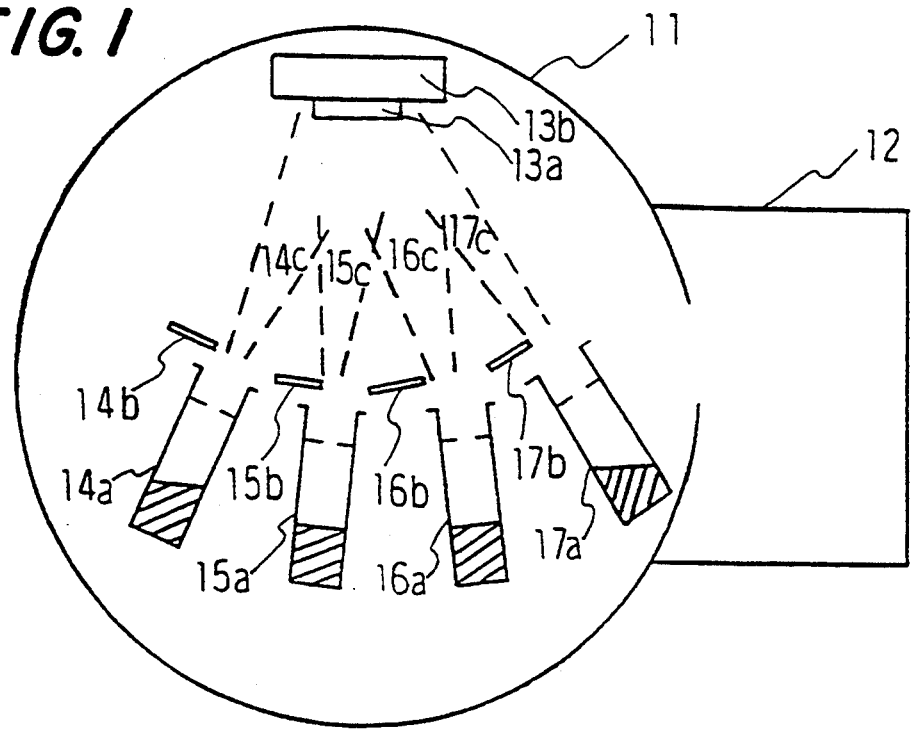
FIG. 1 is a schematic diagram showing the structure of a molecular beam epitaxial growth apparatus for fabricating a mixed crystal of $Zn_{1-x}Mn_xS_ySe_{1-y}$ ($0<x<1$, $0<y1$) in an embodiment of the invention.

According to a preferred embodiment of the invention, a photo semiconductor element material is fabricated from the blue to the ultraviolet region by forming a sulfide-selenide manganese-zinc mixed crystal epitaxial film which is lattice matched to the substrate. The blue laser diode is formed with double hereto quantum well structure on a substrate by using sulfide-selenide manganese-zinc mixed crystal as clad layers.

According to another preferred embodiment of the invention, a zinc molecular beam, a manganese molecular beam, a sulfur molecular beam, and a selenium molecular beam are simultaneously emitted to a GaAs substrate in an ultrahigh vacuum, and a mixed crystal of $Zn_{1-x}Mn_xS_ySe_{1-y}$ (x represent 0 to 1, y represent 0 to 1) is obtained. In particular, the pressure of molecular beam are adjusted to form a mixed crystal whose lattice is matched to the substrate. As the material for the substrate, for example, GaAs and ZnSe may be used.

Moreover, on an n-type GaAs single crystal substrate, a 2 μm thick chlorine doped n-type $Zn_{0.8}Mn_{0.2}S_{0.2}Se_{0.8}$ layer, a 50 nanometer thick ZnSe active layer, and a 1 μm thick nitrogen doped p-type $Zn_{0.8}Mn_{0.2}S_{0.2}Se_{0.8}$ layer are formed. A Pt electrode layer and an In electrode layer are formed at both sides of this structure, and an optical resonator is formed by cleaving. This laser diode emits coherent light in the blue light spection at room temperature under a pulse current injection condition. By forming a sulfide-selenide manganese-zinc mixed crystal which is lattice matched to the substrate, the crystallinity of the ZnMnSSe can be excellent and photo semiconductor can be presented from blue to ultraviolet wavelength region. Moreover, by using the double hereto structure using the sulfide-selenide manganese-zinc mixed crystal which is lattice matched to the substrate as a clad layer and using ZnSe as an active layer, the band offsets between them are large, so that blue laser action at room temperature may be realized.

The invention is described more specifically below by referring to some of the embodiments thereof.

EXAMPLE 1

In one embodiment, an epitaxial film is formed by supplying moderate amount of zinc, manganese, sulfur and selenium onto a substrate. A mixed crystal of $Zn_{1-x}Mn_xS_ySe_{1-y}$ ($0<x<1$, $0<y<1$) which is lattice matched to the substrate is obtained. The crystal structure of the mixed crystal is generally known that there exist many crystal structures which are consisted of the crystal structures of compounds composing the mixed crystal. In this mixed crystal, $Zn_{1-x}Mn_xS_ySe_{1-y}$ ($0<x<1$, $0<y<1$), sphalerite structure, wurtzite structure, and halite structure normally coexist. However, by epitaxial growth in a state nearly lattice matched to the substrate, it comes to have a same crystal structure as the substrate due to strong influence from the crystal structure of the substrate, and a single crystal with very few structural defects is obtained.

A detailed description is given below by reference to the accompanying drawings.

FIG. 1 shows a molecular beam epitaxial growth apparatus used in one embodiment of the invention. In the diagram, numerals 14a, 15a, 16a, 17a are contained in a crucible. Respectively, metal zinc 14a, metal manganese 15a, crystal sulfur 16a, and metal selenium 17a, are heated and evaporated. A zinc molecular beam 14c, a manganese molecular beam 15c, a sulfur molecular beam 16c, a and selenium molecular beam 17c are obtained.

As the procedure of growth, a GaAs substrate 13a having a clarified surface is put onto a substrate holder 13b in a vacuum vessel 11, which is evacuated to an ultrahigh vacuum of about $10^{-9}$ Torr by means of an exhaust device 12. Afterwards, the substrate 13a is heated to about 580° C., and the surface oxide film is removed. The substrate 13a is subsequently cooled to a growth temperature, and molecular beam shutters 14b, 15b, 16b, 17b are opened to start growth. At this time, the substrate temperature is, for example, 300° C., and the temperature of each molecular beam source is preliminarily adjusted so that a composition for lattice matching to the substrate may be obtained. In this case, the temperature of zinc, manganese, sulfur and selenium is, for example, 400° C., 1100° C., 150 ° C., and 350° C., respectively.

The mixed crystal of $Zn_{1-x}Mn_xS_ySe_{1-y}$ formed in this way had the composition ratio of x=0.2, y=0.2. Using X-ray diffraction, the lattice constant was 5.653 angstroms nearly equals to that of the GaAs substrate, and the diffraction spectrum unveiled no other diffraction peak than the peak indicated by the cubic system. Comparing the results by using a transmission electron microscope, this mixed crystal had a perfect sphalerite structure. Band gap of this sample was measured to be 2.9 eV at room temperature by transmission spectrum.

By contrast, in a film in which the lattice constant is different from that of the substrate by 0.1% or more, and the thickness is 1 μm or more, a diffraction peak of a hexagonal structure was seen in the X-ray diffraction spectrum, and it was not a perfect single crystal. This is probably because the lattice matching significantly affects crystallinity. Besides, the photoluminescence spectrum from the lattice matched film had strong near band edge emission, as competed with the film not lattice matched the substrate.

Figure 2:
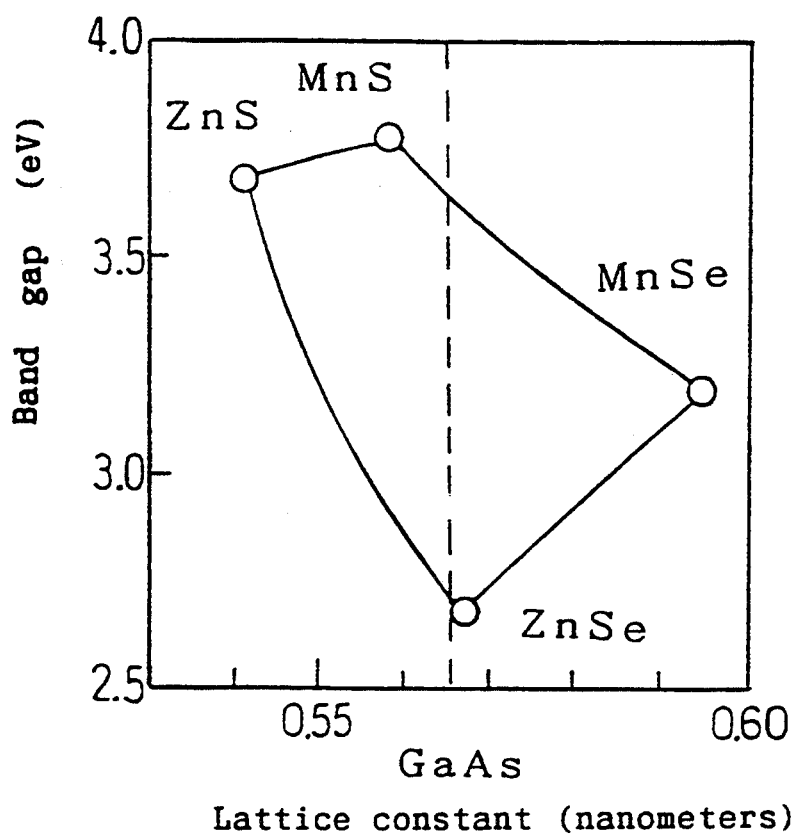
FIG. 2 is a diagram showing the relation between the lattice constant of the mixed crystal of $Zn_{1-x}Mn_xS_ySe_{1-y}$ ($0<x<1$, $0<y<1$) and the band gap, in which the area indicated by the dotted line denotes the range of lattice matching to the GaAs substrate.

FIG. 2 shows the relation between the lattice constant and the band gap of this mixed crystal. When using a GaAs substrate, series of the mixed crystal whose lattices are matched to the substrate is as indicated by the dotted line, and the band gap may range from 2.7 to 3.6 eV at room temperature.

Here, GaAs is used as the substrate. Other substrates may be also. For example, similar effects were obtained by using the single crystal substrate of ZnSe.

In the foregoing embodiment, metal zinc was used as the material for the zinc molecular beam, but similar effects were noted by using organic metal gas containing constituent elements such as dimethyl zinc and diethyl zinc. As the material for the manganese molecular beam, metal manganese was used. Similar effects were confirmed by using organic metal gases containing constituent elements such as dicyclopentadienyl manganese ($Mn(C_5H_5)_2$) and tricarbonylmethyl cyclopentadienyl manganese ($C_6H_8Mn (Co)_3$). Moreover, as the material for the sulfur molecular beam, crystal sulfur was used, but similar effects were observed by using organic sulfur gas containing constituent elements such as dimethyl sulfur, diethyl sulfur, and dimethyl disulfur, and zinc sulfide or hydrogen sulfide gas. Likewise, metal selenium was used as the material for a selenium molecular beam, but similar effects were seen by using organic selenium gas containing constituent elements such as dimethyl selenium and diethyl selenium or hydrogen selenide gas.

In this embodiment, the molecular beam epitaxial growth method is presented as the crystal growth method, but similar effects were noted by the organic metal vapor phase epitaxial growth method.

EXAMPLE 2

In another aspect of the invention, $Zn_{1-x}Mn_xS_ySe_{1-y}$ ($0<x<1$, $0<y<1$) is used as the material for the clad layer, and ZnSe as the material for the active layer. Structurally, an n-type type $Zn_{1-x}Mn_xS_ySe_{1-y}$ ($0<x<1$, $0<y<1$) clad layer, a ZnSe active layer, and p-type $Zn_{1-x}Mn_xS_ySe_{1-y}$ ($0<x<1$, $0<y<1$) clad layer are epitaxially grown sequentially on a substrate in a lattice matching state or in a state free from lattice relaxation, thereby forming a laser diode.

Further description is made by reference to the drawings.

Figure 3:
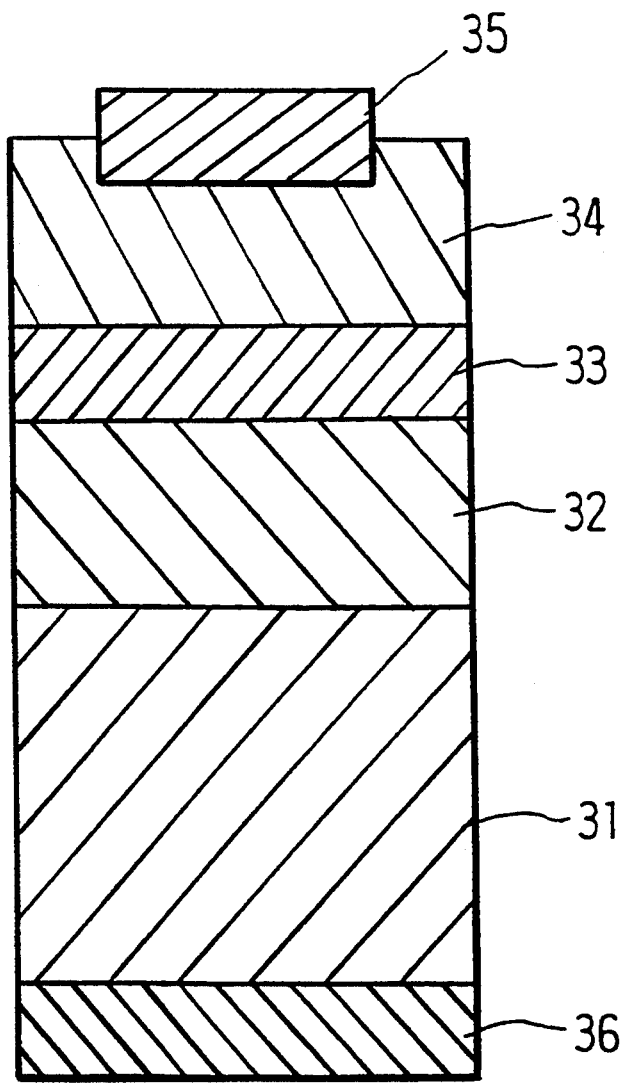
FIG. 3 is a sectional view showing the structure of a laser diode in an embodiment of the invention.

FIG. 3 is a schematical cross section of a laser diode of the invention. In FIG. 3, numeral 31 is a silicon doped n-type GaAs substrate, 32 is a chlorine doped n-type $Zn_{0.8}Mn_{0.2}S_{0.2}Se_{0.8}$ layer formed on its surface of the GaAs substrate, 33 is a ZnSe layer formed on its surface, 34 is Nitrogen doped p-type $Zn_{0.8}Mn_{0.2}S_{0.2}Se_{0.8}$ layer formed on its surface, 35 is an Au electrode formed on its surface layer, and 36 is an In electrode formed on the back side of the GaAs substrate 31. Epitaxial films composed of the chlorine doped n-type $Zn_{0.8}Mn_{0.2}S_{0.2}Se_{0.8}$ layer 32, the ZnSe layer 33, and the nitrogen added p-type $Zn_{0.8}Mn_{0.2}S_{0.2}Se_{0.8}$ layer 34 form a double hereto structure.

As the method for forming the double hetero structure, the molecular beam epitaxial growth method is preferable. As the substrate, the GaAs single crystal substrate 31 was used. The GaAs substrate 31 was of low resistance n-type so that the electrode could be obtained from the substrate. As for substrate, the GaAs and ZnSe substrates are advantageous because they are excellent in crystallinity, capable of matching the mixed crystal film in lattice, and superior in the crystallinity and optical properties of element.

In order to obtain $Zn_{1-x}Mn_xS_ySe_{1-y}$ ($0<x<1$, $0<y<1$) having excellent crystallinity, the growth temperature was set between 300° C. and 350° C. In an ultrahigh vacuum, the substrate 31 was irradiated with the molecular beams of metal zinc, metal manganese, crystal sulfur and metal selenium and with the molecular beam of zinic chloride ($ZnCl_2$) as the donor source. In this way a 2 $\mu$m thick chlorine added n-type $Zn_{0.8}Mn_{0.2}S_{0.2}Se_{0.8}$ layer 32 was formed. The thickness of the ZnMnSSe layer is preferably 2 $\mu$m, but the case that the thickness is 0.5 $\mu$m, it had a sufficient crystal quality for a laser diode. The mixed crystal composition and film thickness is not limited to this embodiment alone, as long as lattice relaxation is not initiated. This embodiment, however, is preferable because it is superior in crystallinity and excellent in electric and optical characteristics.

In consequence, by emitting the molecular beams of zinc and selenium onto the n-type mixed crystal layer 32, a 50 nanometers (500 angstroms) thick ZnSe active layer 32 is formed. Here, the thickness of the active layer 33 is 50 nanometers, the emission efficiency was high within a film thickness range of 5.0 nanometers to 150 nanometers. Below 5 nanometers, the carrier did not accumulate sufficiently. Above 150 nanometers, lattice relaxation was induced, and crystallinity was getting poor. Hence, efficiency was lowered.

Next, together with the molecular beams of zinc, manganese, sulfur and selenium, by emitting the molecular beam of active nitrogen as acceptor source to the active layer 33, a 1 $\mu$m thick nitrogen doped p-type $Zn_{0.8}Mn_{0.2}S_{0.2}Se_{0.8}$ layer 34 was formed. At this time. The film thickness of this layer was about 1 $\mu$m. As long as the thickness of the layer is at least 0.8 $\mu$m, degrade of active layer in forming electrode may be avoided. In this case, too, the same as in the n-type layer, the mixed crystal composition and film thickness are not limited to the conditions in this embodiment alone, as long as lattice relaxation is not initiated. This embodiment is, however, preferable because it is superior in crystallinity and excellent in electrical and optical characteristics.

Furthermore, the Au electrode 35 was evaporated onto the p-type $Zn_{0.8}Mn_{0.2}S_{0.2}Se_{0.8}$ layer, and the In electrode 35 was evaporated onto the back side of the n-type GaAs substrate 31.

Finally by cleaving so that the vertical and lateral length may be about 500 $\mu$m, a cleavage mirror was formed on the end surface and obtained as a resonator.

Thus obtained laser diode emit coherent light at a blue wavelength region of 480 nm by pulse current injection. By varying the thickness of the active layer to take in the quantum effect, laser diodes were fabricated in a range up to 440 nm. All of these were particularly high in emission efficiency, but when the thickness of the active layer (well layer) was less than 5.0 nanometers, the absolute quantity of carries accumulated in the active layer was small, and emission efficiency was lowered.

Here, the molecular beam epitaxial growth method was employed for crystal growth, but similar growth is achieved by other methods, such as by the MOCVD method and other vapor phase growth methods, by changing over the material gases.

As the dopant of n-type layer, chlorine was used in this embodiment, but aluminum, gallium, indium, fluorine, iodine, and bromine are also desired in that low resistance samples are obtained.

Moreover, as the dopant of p-type layer, nitrogen was used, but phosphorus, arsenic, lithium, and sodium are preferred in that low resistance samples are obtained.

The carrier density of the thin films of n-type and p-type $Zn_{1-x}Mn_xS_ySe_{1-y}$ ($0<x<1$, $0<y<1$) should be preferably $5\times10^{16}$ cm$^{-3}$ or more at room temperature in order to obtain a sufficient electric conductivity.

Incidentally, by applying the structure of exchanging p-type and n-type, nearly similar characteristics were presented.

Furthermore, when the active layer was formed in a multiple quantum well structure, it was confirmed that the threshold current density for laser action was lowered. Or when the active layer was a mixed crystal of $Zn_{1-z}Cd_zS_wSe_{1-w}$ ($0<z<1$, $0<w<1$) lattice matched to the substrate, although the wavelength of laser light was variable depending on the composition of the mixed crystal used, lasers in a range of 430 to 480 nm were obtained as converted to room temperature.

According to Example 2, on the silicon doped n-type GaAs single crystal substrate 31, the 2 μm thick chlorine doped n-type $Zn_{0.8}Mn_{0.2}S_{0.2}Se_{0.8}$ layer 32, the 50 nanometer thick ZnSe layer 33, and the 1 μm thick nitrogen doped p-type $Zn_{0.8}Mn_{0.2}S_{0.2}Se_{0.8}$ layer 34 are formed. The Au electrode 35 and the In electrode 36 are formed on both sides of this structure, and an optical resonator by cleavage mirror is formed. This laser diode emit coherent light in the blue spectrum at room temperature in the pulse current injection condition. That is, the band gap of the active layer is as large as 2.7 eV, and the band offsets between the clad layer and the active layer are large in both the conduction band and the valence band. This is a double hereto structure in which laser action occurs in the blue spectrum at room temperature in the pulse injection condition.

The principle of operation of the laser diode described herein is the same as in a conventional laser diode, but in the case of this invention, the band gap of the active layer is large, and the band offset from the clad layer is large in both the conduction band and the valence band. Laser action is therefore possible in a high photon energy region (blue) which was impossible in the prior art.

As described herein, according to the invention, a sulfide-selenide manganese-zinc epitaxial mixed crystal comprising at least zinc, manganese, sulfur and selenium is formed on a substrate. This film is lattice matched to the substrate, thereby producing a semiconductor possessing excellent crystallinity, and which is capable of being applied to a novel photo semiconductor element from blue to ultraviolet region.

Moreover, the epitaxial layer on the substrate possesses a double hetero quantum well structure, and the clad layers of this structure are mixed crystal layers of n-type and p-type $Zn_{1-x}Mn_xS_ySe_{1-y}$ (x represents 0 to 1, y represents 0 to 1). The active layer between the n-type mixed crystal layer and p-type mixed crystal layer is ZnSe or a mixed crystal of $Zn_{1-z}Cd_zS_wSe_{1-w}$ (z represents 0 to 1, w represents 0 to 1) lattice matched to the substrate. Therefore, the band gap of the active layer is large, and the band offsets between the clad layer and the active layer are large in both the conduction band and the valence band, so that laser oscillation in a high photon energy region (blue) is possible, which is greatly effective in high density optical recording and information transmission, and is extremely useful practically.

As has been shown, the invention is greatly beneficial to industry.

The invention may be embodied in other specific forms without departing from the spirit or essential characteristics thereof. The present embodiment is to be considered in all respects as illustrative and not restrictive, the scope of the invention being indicated by the appended claims rather than by the foregoing description and all changes which come within the meaning and range of equivalency of the claims are intended to be embraced therein.

What is claimed is:

1. A laser diode, comprising a double hetero quantum well structure on a substrate, whose clad layers are mixed crystal layers of n-type and p-type $Zn_{1-x}Mn_xS_ySe_{1-y}$, wherein, which is lattice matched to the substrate, and whose active layer between the n-type clad layer and p-type clad layer is ZnSe or a mixed crystal of $Zn_{1-z}Cd_zS_wSe_{1-w}$, and wherein the active layer has a thickness of between 5.0 and 150 nm.

2. The laser diode of claim 1, wherein a compound selected from aluminum, gallium, indium, fluorine, chlorine, iodine, and bromine is doped as an n-type impurity of the mixed crystal of n-type $Zn_{1-x}Mn_xS_ySe_{1-y}$ ($0<x<1$, $0<y<1$), a compound selected from nitrogen, phosphorus, arsenic, lithium, and sodium is doped as a p-type impurity of the mixed crystal of p-type $Zn_{1-x}Mn_xS_ySe_{1-y}$ ($0<x<1$, $0<y<1$).

3. The laser diode of claim 1 or 2, wherein the quantum well structure is formed in a state selected from the group consisting of a lattice matched state on the substrate and a state not inducing lattice relaxation.

4. The laser diode of claim 1 or 2, wherein the mixed crystals of n-type an p-type $Zn_{1-x}Mn_xS_ySe_{1-y}$ ($0<x<1$, $0<y<1$) have a carrier density at room temperature of $5\times10^{16}$ cm$^{-3}$ or more.

5. The laser diode of claim 1, wherein the substrate is selected from the group consisting of a GaAs single crystal and a ZnSe single crystal.

* * * * *